(12) United States Patent
Choi et al.

(10) Patent No.: US 8,381,063 B2
(45) Date of Patent: Feb. 19, 2013

(54) DECODING APPARATUS AND METHOD BASED ON VARIABLE ERROR CORRECTION VALUE

(75) Inventors: Euna Choi, Daejon (KR); Dae-Ig Chang, Daejon (KR); Kijoon Lee, Seoul (KR); Habong Jung, Seoul (KR)

(73) Assignee: Electronics and Telecommunications Research Institute, Daejon (KR)

( * ) Notice: Subject to any disclaimer, the term of this patent is extended or adjusted under 35 U.S.C. 154(b) by 333 days.

(21) Appl. No.: 12/808,319

(22) PCT Filed: Dec. 15, 2008

(86) PCT No.: PCT/KR2008/007419
§ 371 (c)(1),
(2), (4) Date: Jun. 15, 2010

(87) PCT Pub. No.: WO2009/078644
PCT Pub. Date: Jun. 25, 2009

(65) Prior Publication Data
US 2010/0262888 A1    Oct. 14, 2010

(30) Foreign Application Priority Data

Dec. 15, 2007  (KR) .................. 10-2007-0131837
May 9, 2008   (KR) .................. 10-2008-0043579

(51) Int. Cl.
*H03M 13/00* (2006.01)

(52) U.S. Cl. .................. 714/752; 375/262; 375/341

(58) Field of Classification Search .................. 714/752; 375/262, 341
See application file for complete search history.

(56) References Cited

U.S. PATENT DOCUMENTS

| 7,174,495 | B2* | 2/2007 | Boutillon et al. | 714/752 |
| 7,340,671 | B2* | 3/2008 | Jones et al. | 714/800 |
| 7,458,009 | B2* | 11/2008 | Yu et al. | 714/800 |
| 7,586,953 | B2* | 9/2009 | Forest et al. | 370/503 |

FOREIGN PATENT DOCUMENTS

KR    1020040101743    12/2004

OTHER PUBLICATIONS

Chen, Jinghu et al., "Density Evolution for Two Improved BP-Based Decoding Algorithms of LDPC Codes," IEEE Communications Letters, vol. 6(5):208-210 (2002).
Chen, Jinghu et al., "Reduced-Complexity Decoding of LDPC Codes," IEEE Transactions on Communications, vol. 53(8):1288-1299 (2005).

* cited by examiner

*Primary Examiner* — Esaw Abraham
(74) *Attorney, Agent, or Firm* — Nelson Mullins Riley & Scarborough LLP; EuiHoon Lee, Esq.

(57) ABSTRACT

Provided is a decoding apparatus and method based on a variable error correction value. The decoding method includes setting an initial normalized factor and a normalized factor correction value, initially updating a check node based on the initial normalized factor, and updating the check node based on a variable error correction value acquired by adding the initial normalized factor and the normalized factor correction value.

14 Claims, 5 Drawing Sheets

DECODING APPARATUS AND METHOD BASED ON VARIABLE ERROR CORRECTION VALUE

RELATED APPLICATIONS

This application is a 35 U.S.C. §371 national stage filing of PCT Application No. PCT/KR2008/007419 filed on Dec. 15, 2008, which claims priority to, and the benefit of, Korean Patent Application No. 10-2007-0131837 filed on Dec. 15, 2007 and Korean Patent Application No. 10-2008-0043579 filed on May 9, 2008. The contents of the aforementioned applications are hereby incorporated by reference.

TECHNICAL FIELD

The present invention relates to a decoding apparatus and method based on a variable error correction value; and, more particularly, to a decoding apparatus and method which can improve decoding performance by providing a modified min-sum algorithm using the variable error correction value whenever decoding is performed in a check node updating operation and applying the modified min-sum algorithm to a Low Density Parity Check (LDPC) code of a DVB-S2 standard.

This work was supported by the IT R&D program of MIC/IITA [2007-S-008-01, "Development of 21 GHz Band Satellite Broadcasting Transmission Technology"].

BACKGROUND ART

A Low Density Parity Check (LDPC) code is introduced by Gallager in 1960s, and has received rare reviews due to its an excellent decoding performance close to a theoretical limitation of Shannon for various channel types.

A parity check matrix of the LDPC code is mostly formed of '0' elements. Thus, an iterative decoding based on probability can be easily implemented due to low density that the number of non-zero elements is small, compared with a code length of the LDPC code.

Recently, the LDPC code is drawing attention as a research theme of an error correction code field, and actually suggested and used as a standard in various fields, e.g., communication, broadcasting and storage media.

It is known that superior decoding performance can be obtained when the LDPC code is decoded by using a Belief Propagation (BP) algorithm such as a sum-product algorithm. However, calculation complexity is increased when reliable information is to be restored through the BP algorithm. In addition, since a code having a long code length such as the LDOC code of the DVB-S2 standard has a high decoding complexity, it is required to develop a new method that can decrease the calculation complexity of decoding.

The BP algorithm can be simply modified into an approximation method based on the BP. The approximation method is also called a min-sum approximation. The approximation method may decrease decoding complexity, but it deteriorates decoding performance.

Hereafter, a decoding method of the LDPC code will be described.

In a BP iterative decoding method is an algorithm for correcting errors by repeatedly exchanging messages between a variable node and check node of a Tanner graph and updating messages in each node. The BP iterative decoding method uses a Log-Likelihood Ratio (LLR) values not a posterior probability as the messages needed for decoding in a Binary-Input Additive White Gaussian Noise (BIAWGN) channel.

Hereafter, a general sum-product algorithm of the LDPC code using the LLR values will be described. The general sum-product algorithm is also called a standard BP.

The parity check matrix of the LDPC code is defined as $H=[h_{nm}]$; a set of variable nodes connected to $m^{th}$ check node is defined as $N(m)=\{n|h_{nm}=1\}$; and a set of check nodes connected to $n^{th}$ variable node is defined as $M(n)=\{m|h_{nm}=1\}$. Also, a codeword transmitted using a Binary Phase Shift Keying (BPSK) is defined as)

$w=(w_1, w_2, \ldots, w_N)$ in an Additive White Gaussian Noise (AWGN) channel having an average of 1 and a dispersion of $\sigma^2 = N_0/2$; and a reception signal is defined as $y=(y_1, y_2, \ldots, y_N)$.

Based on the definition and assumption, an LLR value $L(y_n)$ corresponding to a reception signal of $n^{th}$ variable node is expressed as the following Equation 1.

$$L(y_n) = \log \frac{P(w_n = 0 | y_n)}{P(w_n = 1 | y_n)} = 4\frac{y_n}{N_0} = 2\frac{y_n}{\sigma^2} \qquad \text{Eq. 1}$$

Meanwhile, $q_{nm}(x)$ is defined as a probability that a variable n is x, where $x \in \{0,1\}$, under the condition that $M(n)$ check nodes except the $m^{th}$ check node are satisfied. Similarly, $r_{nm}(x)$ is defined as a probability that the $m^{th}$ check node is satisfied under the condition that the variable n is x, where $x \in \{0,1\}$. Also, a posterior LLR value of the $n^{th}$ variable node for a temporary decoding is defined as $z_n^{(i)}$.

When the iteration number is i, where 'i' is integer, an LLR message $z_{nm}^{(i)}$ transmitted from the $n^{th}$ variable node to the $m^{th}$ check node and an LLR message $\varepsilon_{mn}^{(i)}$ transmitted from the $m^{th}$ check node to the $n^{th}$ variable node are expressed as the following Equation 2.

$$z_{nm}^{(i)} = \log\left\{\frac{q_{nm}^{(i)}(0)}{q_{nm}^{(i)}(1)}\right\}, \varepsilon_{mn}^{(i)} = \log\left\{\frac{r_{mn}^{(i)}(0)}{r_{mn}^{(i)}(1)}\right\} \qquad \text{Eq. 2}$$

Meanwhile, the sum-product algorithm of the BP iterative decoding method will be described.

First, $z_{nm}^{(0)} = L(y_n)$ is calculated for each of the numbers n and m based on the reception signal y received through the channel.

Then, in an iterative decoding, a check node updating operation is performed based on the following Equation 3 for each m or n, where $n \in N(m)$.

$$\varepsilon_{mn}^{(i)} = 2\tanh^{-1}\left(\prod_{n' \in N(m)\backslash n} \tanh(z_{n'm}^{(i-1)}/2)\right) \qquad \text{Eq. 3}$$

Continuously, a variable node updating operation is performed based on the following Equations 4 and 5 for each n or m, where $m \in M(n)$.

$$\hat{z}_{nm}^{(i)} = L(y_n) + \sum_{m' \in M(n) \backslash m} \varepsilon_{m'n}^{(i)} \qquad \text{Eq. 4}$$

$$\hat{z}_n^{(i)} = L(y_n) + \sum_{m \in M(n)} \varepsilon_{mn}^{(i)} \qquad \text{Eq. 5}$$

In the temporary decoding step, if
$z_n^{(i)}$
is larger than 0, $n^{th}$ symbol $w_n$ of a temporary codeword is set to 0. Otherwise, $w_n$ is set to 1. If $H(w)^T = 0$ is satisfied, the temporary decoding is suspended. If not, the above steps, i.e., the check node updating operation and the variable node updating operation, are repeatedly performed until the iteration number reaches maximum iteration number.

Meanwhile, the min-sum approximation method simplifies the check node updating operation and reduces calculation complexity of the sum-product algorithm. In the sum-product algorithm, a hyperbolic tangent function of the check node updating operation has highest calculation amount. The hyperbolic tangent function is substituted with a minimum value of messages transmitted from neighboring variable nodes, approximated, and expressed as the following Equation 6.

$$\varepsilon_{mn}^{(i)} = \left( \prod_{n' \in N(m) \backslash n} \text{sign}(z_{n'm}^{(i-1)}) \right) \times \min_{n' \in N(m) \backslash n} (|z_{n'm}^{(i-1)}|) \qquad \text{Eq. 6}$$

Generally, it is known that error probability of decoding method based on the min-sum approximation method is larger than error probability of the sum-product algorithm. When the Equations 3 and 6 are compared,
$\varepsilon_{mn}^{(i)}$
based on the min-sum approximation method is equal to or greater than
$\varepsilon_{mn}^{(i)}$
based on the sum-product algorithm all the time.

Therefore, two methods are used to acquire check node update value similar to the value of the Equation 3 based on the Equation 6.

One is a method of updating the check node by using a normalized factor
$\gamma$
as shown in the following Equation 7.

$$\varepsilon_{mn}^{(i)} = \left( \prod_{n' \in N(m) \backslash n} \text{sign}(z_{n'm}^{(i-1)}) \right) \times \gamma \times \min_{n' \in N(m) \backslash n} (|z_{n'm}^{(i-1)}|) \qquad \text{Eq. 7}$$

The method is called a normalized BP approximation method and it improves decoding performance by using a normalized factor smaller than 1 as shown in the Equation 7.

The other is a method called an offset BP approximation method of updating the check node by sing an offset factor $\beta$. As shown in Equation 8 below, check node updating operation is performed using the offset factor $\beta$, where $\beta$ is positive value.

$$\varepsilon_{mn}^{(i)} = \left( \prod_{n' \in N(m) \backslash n} \text{sign}(z_{n'm}^{(i-1)}) \right) \times \max \left\{ \min_{n' \in N(m) \backslash n} |z_{n'm}^{(i-1)}| - \beta, 0 \right\} \qquad \text{Eq. 8}$$

As shown in Equations 7 and 8, in improved two approximation methods, the approximation includes determining whether an equation value is positive or negative, searching for a minimum element among the set
$\{z_{n'm}^{(i-1)} | n' \in N(m) \backslash n\}$
as a representative value, and correcting an effect which
$z_{n'm}^{(i-1)}$
except the representative value affects
$\varepsilon_{mn}^{(i)}$.

Herein, the correction values
$\gamma$
and $\beta$ are fixed values used in the part of correcting the effect which $z_{n'm}^{(i-1)}$
except the representative value affects
$\varepsilon_{mn}^{(i)}$.

That is, an effect of
$z_{n'm}^{(i-1)}$
varying at every iteration number is not considered.

Referring to FIGS. 1 and 2, in the sum-product algorithm, distribution state of
$z_{n'm}^{(i-1)}$
for each iteration number will be described.

FIG. 1 is a graph illustrating a magnitude distribution of messages outputted from a variable node in the sum-product algorithm. The drawing shows a distribution of an absolute LLR value
$|z_{n'm}^{(i-1)}|$
corresponding to a specific reception signal for the LDPC code having a code rate of 1/2 of DVB-S2 standard and a length 64800 when a signal-to-noise ratio ($E_b/N_0$) is 1.0 dB.

FIG. 2 is a graph illustrating another magnitude distribution of messages outputted from the variable node in the sum-product algorithm. The drawing shows a distribution of
$|z_{n'm}^{(i-1)}|$
corresponding to a specific reception signal for the LDPC code having a code rate of 8/9 of DVB-S2 standard and a length 64800 when the signal-to-noise ratio ($E_b/N_0$) is 3.6 dB.

The distribution varies according to reception signals, but simulations showed that the above distribution is obtained.

As shown in FIGS. 1 and 2, when code rate is relatively low, the magnitude distribution of messages outputted from the variable node moves to the right side rapidly as the decoding iteration number is increased. When the code rate is high, as the decoding iteration number is increased, the magnitude distribution makes a little more.

In case of the high code rate is high, a performance similar to the BP algorithm can be acquired by using a fixed factor. At a relatively low code rate, however, the performance is deteriorated compared to the sum-product algorithm.

In case of the high code rate, the decoding performance based on the fixed factor to compensate for the effect of
$z_{n'm}^{(i-1)}$
except the representative value affects
$\varepsilon_{mn}^{(i)}$
is similar to that of the BP algorithm. However, at a low code rate, the decoding performance based on the fixed factor is much smaller than the decoding performance of the BP algorithm.

Since the LDPC code is decoded using the fixed factor in the conventional normalized BP algorithm and the conventional offset BP algorithm, the decoding performance is deteriorated at low code rate.

DISCLOSURE OF INVENTION

Technical Problem

An embodiment of the present invention is directed to providing a decoding apparatus and method which can provide optimal decoding performance under a low code rate by using the variable error correction value for every decoding in a check node updating operation.

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Technical Solution

In accordance with an aspect of the present invention, there is provided a decoding method, including: setting an initial normalized factor and a normalized factor correction value; initially updating a check node based on the initial normalized factor; and updating the check node based on a variable error correction value acquired by adding the initial normalized factor and the normalized factor correction value.

In accordance with another aspect of the present invention, there is provided a decoding method, including: setting an initial offset factor and an offset factor correction value; initially updating a check node based on the initial offset factor; and updating the check node based on a variable error correction value acquired by multiplying the initial offset factor by the offset factor correction value.

In accordance with another aspect of the present invention, there is provided a decoding apparatus, including: a initial setting unit for setting an initial normalized factor and a normalized factor correction value; and a check node updating unit for initially updating a check node based on the initial normalized factor and updating the check node based on a variable error correction value acquired by adding the initial normalized factor and the normalized factor correction value.

In accordance with another aspect of the present invention, there is provided a decoding apparatus, including: a initial setting unit for setting an initial offset factor and a offset factor correction value; and a check node updating unit for initially updating a check node based on the initial offset factor and updating the check node based on a variable error correction value acquired by multiplying the initial offset factor by the offset factor correction value.

Advantageous Effects

The present invention provides optimal decoding performance at a low code rate by using the variable error correction value for every decoding in a check node updating operation.

BEST MODE FOR CARRYING OUT THE INVENTION

The advantages, features and aspects of the invention will become apparent from the following description of the embodiments with reference to the accompanying drawings, which is set forth hereinafter. Therefore, those skilled in the field of this art of the present invention can embody the technological concept and scope of the invention easily. In addition, if it is considered that detailed description on a related art may obscure the points of the present invention, the detailed description will not be provided herein. The preferred embodiments of the present invention will be described in detail hereinafter with reference to the attached drawings.

Figure 1:
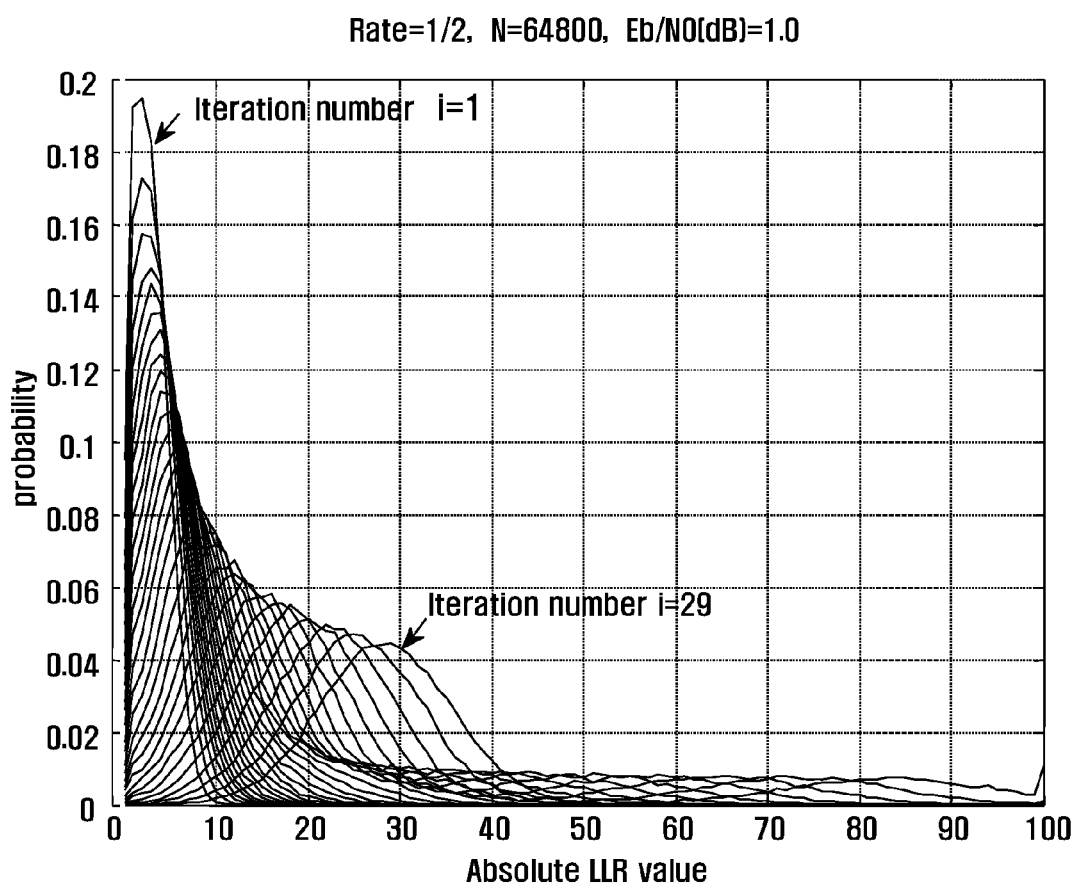
FIG. 1 is a graph illustrating a magnitude distribution of messages outputted from a variable node in a conventional sum-product algorithm.
Figure 2:
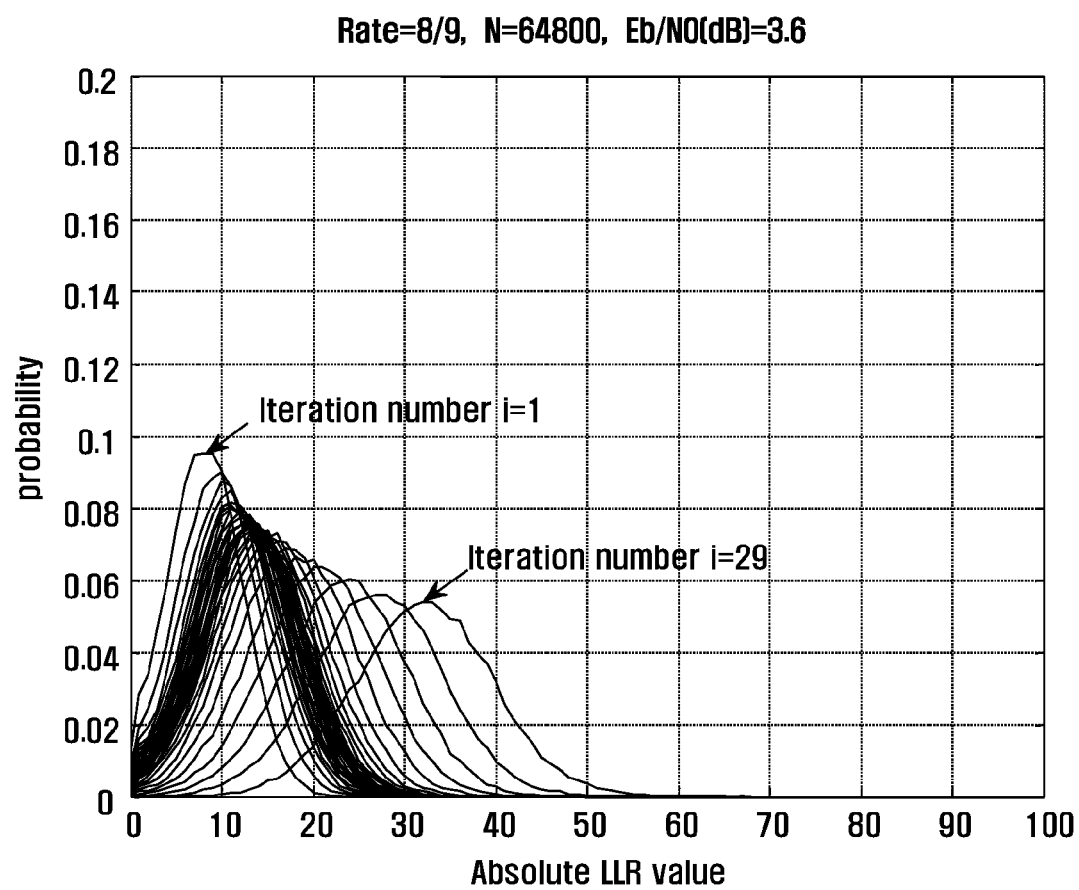
FIG. 2 is a graph illustrating another magnitude distribution of messages outputted from a variable node in a conventional sum-product algorithm.
Figure 3:
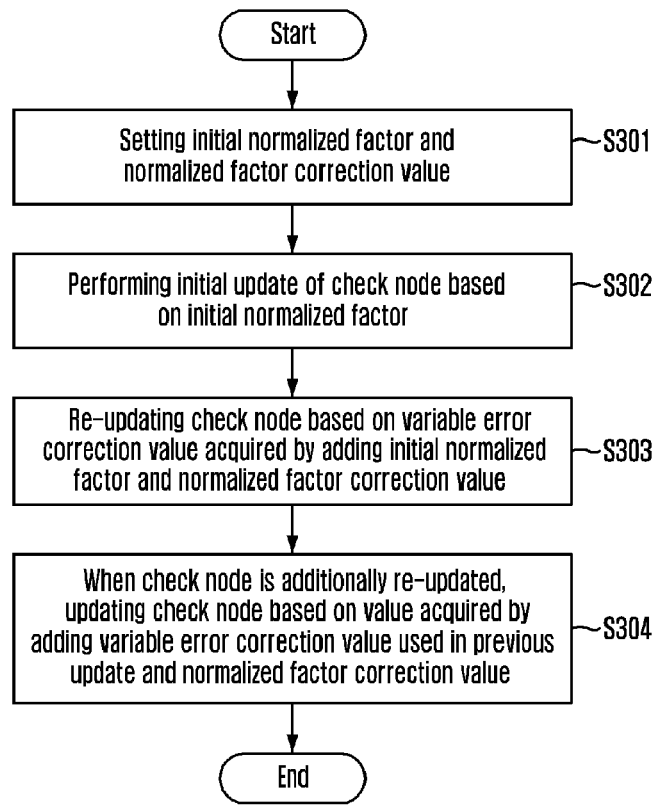
FIG. 3 is a flowchart describing a decoding method using a variable error correction value in accordance with an embodiment of the present invention.

FIG. 3 is a flowchart describing a decoding method using a variable error correction value in accordance with an embodiment of the present invention.

First, an initial normalized factor and a normalized factor correction value are set at step S301.

At step S302, a check node is initially updated based on the initial normalized factor.

At step S303, a variable error correction value is acquired by adding the initial normalized factor and the normalized factor correction value, and the check node is re-updated based on the variable error correction value.

At step S304, when the check node is re-updated, a first value is produced by adding the normalized factor correction value and the variable error correction value used in the previous update, and the first value is used as a variable error correction value in the re-update.

In the check node updating operation, when values of messages inputted into the check node are large, values of messages outputted from the check node are large. Thus, as the iteration number is increased, the normalized factor $\gamma$ is increased at an appropriate ratio, too.

Figure 4:
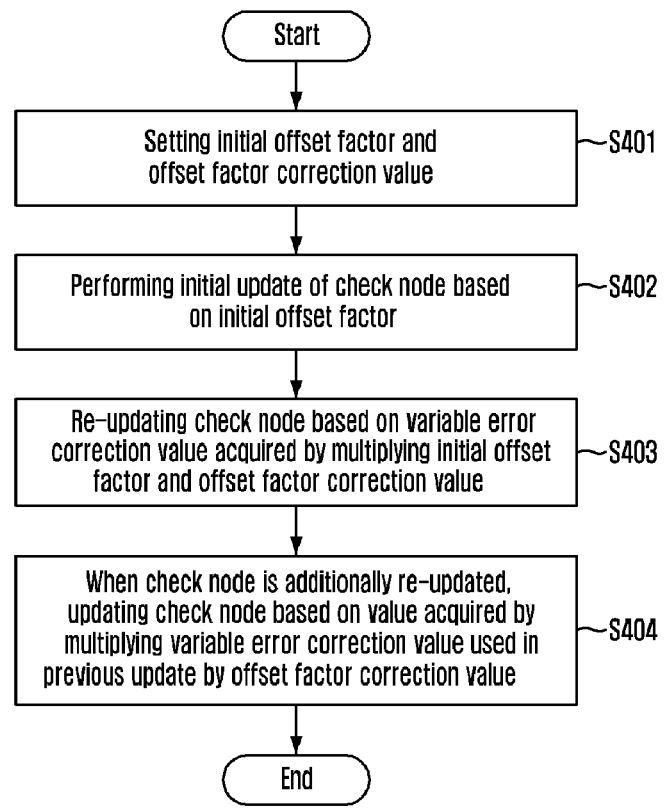
FIG. 4 is a flowchart describing a decoding method using a variable error correction value in accordance with another embodiment of the present invention.

FIG. 4 is a flowchart describing a decoding method using a variable error correction value in accordance with another embodiment of the present invention.

First, an initial offset factor and a offset factor correction value are set at step S401.

At step S402, a check node is initially updated based on the initial offset factor.

At step S403, a variable error correction value is produced by multiplying the initial offset factor by the offset factor correction value, and the check node is re-updated based on the variable error correction value.

At step S404, when the check node is re-updated, a second value is produced by multiplying the offset factor correction value by the variable error correction value used in the previous update, and the second value is used as a variable error correction value in the present update.

In the check node updating operation, when values of messages inputted into the check node are large, values of messages outputted from the check node are large. Thus, as the iteration number is increased, the offset factor $\beta$ is decreased at an appropriate ratio, too.

Hereafter, decoding based on the variable error correction value will be described in detail.

In an initial setting operation, an iteration number i is equal to 1; a maximum iteration decoding number is $I_{max}$; $z_n^{(0)}=z_{nm}^{(0)}=L(y_n)$ is set for all n and m; and the initial normalized factor $\gamma^{(1)}$, the initial offset factor $\beta^{(1)}$, the normalized factor correction value $\Delta\gamma$ and the offset factor correction value $\Delta\beta$ are set.

Subsequently, message exchange and the check node updating and the variable node updating are performed.

In order to improve performance of the normalized BP algorithm, the check node is updated based on the following Equation 9.

$$\varepsilon_{mn}^{(i)} = \left(\prod_{n'\in N(m)\backslash n} \text{sign}(z_{n'm}^{(i-1)})\right) \times \gamma^{(i)} \times \min_{n'\in N(m)\backslash n} |z_{n'm}^{(i-1)}| \quad \text{Eq. 9}$$

where $1 \leq n \leq N$; and $m \in M(n)$.

Meanwhile, in order to improve performance of the offset BP algorithm, the check node is updated based on the following Equation 10.

$$\varepsilon_{mn}^{(i)} = \left(\prod_{n'\in N(m)\backslash n} \text{sign}(z_{n'm}^{(i-1)})\right) \times \max\left\{\min_{n'\in N(m)\backslash n} |z_{n'm}^{(i-1)}| - \beta^{(i)}, 0\right\} \quad \text{Eq. 10}$$

where $1 \leq n \leq N$; and $m \in M(n)$.

Subsequently, the variable node is updated based on the following Equation 11.

$$z_{nm}^{(i)} = L(y_n) + \sum_{m'\in M(n)\backslash m} \varepsilon_{m'n}^{(i)} \quad \text{Eq. 11}$$

$$z_n^{(i)} = L(y_n) + \sum_{m'\in M(n)} \varepsilon_{m'n}^{(i)}$$

Subsequently, a temporary codeword $\hat{w}^{(i)}=[\hat{w}_n^{(i)}]$ is calculated based on the following Equation 12.

$$\begin{cases} w_n^{(i)} = 0, & \text{if } z_n^{(i)} > 0 \\ w_n^{(i)} = 1, & \text{if } z_n^{(i)} < 0 \end{cases} \quad \text{Eq. 12}$$

To be specific, if $Hw^{(i)}=0$ is satisfied or i is equal to $I_{max}$, the decoding process is suspended and decoded codeword is determined as $w^{(i)}$ and outputted. Otherwise, the iteration number i is increased by 1 (i=i+1), the following operation is performed. Then, the check node is re-updated.

Normalized BP algorithm:

$\gamma^{(i)}=\gamma^{(i-1)}+\Delta\gamma$

Offset BP algorithm:

$\beta^{(i)}=\beta^{(i-1)}\times\Delta\beta$

In the present invention, the decoding performance varies based on two factors, i.e., $\gamma^{(1)}$ and $\Delta\gamma$ (or $\beta^{(1)}$ and $\Delta\beta$).

The two factors are not determined based on the specific element of the code. As a parity check matrix of the code is changed, a message distribution outputted from the variable node is changed. Therefore, optimal $\gamma^{(1)}$ and $\Delta\gamma$ (or $\beta^{(1)}$ and $\Delta\beta$)

are searched for all codes.

The normalized factor, the normalized factor correction value, the offset factor and the offset factor correction value having excellent performance will be searched for the LDPC code of the DVB-S2 standard.

Figure 5:
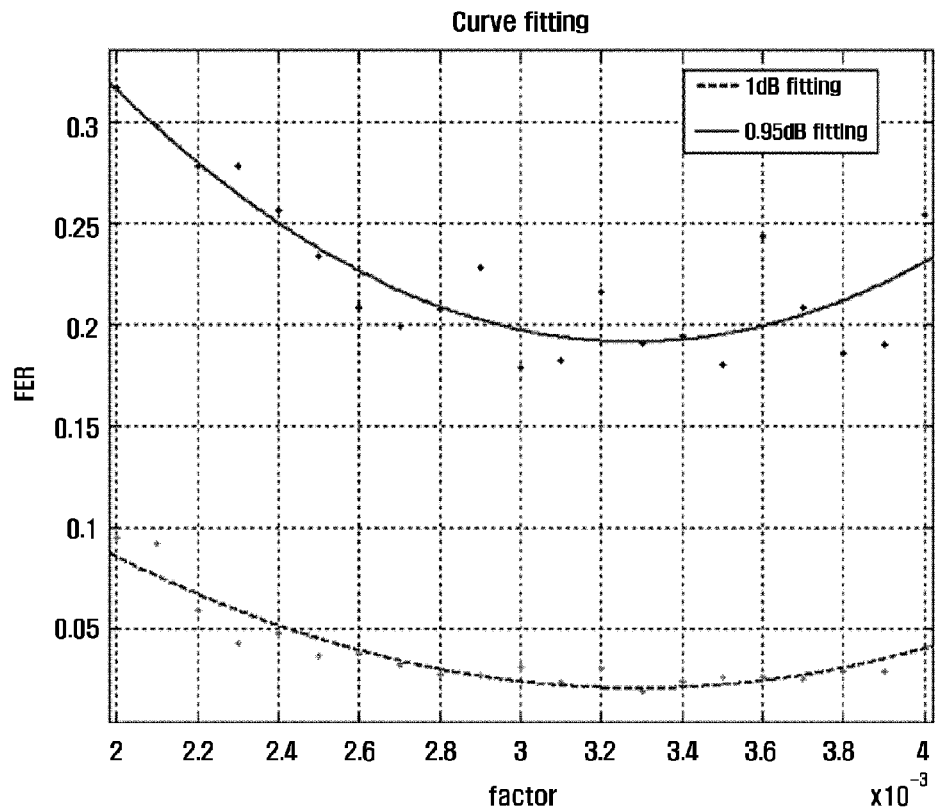
FIG. 5 shows a variable error correction value in accordance with an embodiment of the present invention.

FIG. 5 shows a variable error correction value in accordance with an embodiment of the present invention. The drawing shows the performance according to the $\Delta\gamma$ variation for the LDPC code of DVB-S2 standard having a code rate of 1/2 and a length of 64800 when a signal-to-noise ratio ($E_b/N_0$) is 0.95 dB or 1.0 dB, and $\gamma^{(1)}$ is 0.75.

Herein, the maximum iteration number $I_{max}$ is defined as 50; a large amount of values are simulated for the normalized factor, the offset factor, the normalized factor correction value, and the offset factor correction value in order to find the optimal values having superior performance; and the optimal values are selected based on a curve fitting method. Herein, simulation values are connected in the form of a curve when $E_b/N_0$ is 0.95 dB or 1.0 dB; and a peck is determined as $\Delta\gamma$ based on the curve fitting method.

Table 1 and Table 2 preset values of $\gamma^{(1)}$, $\Delta\gamma$, $\beta^{(1)}$ and $\Delta\beta$ having fine performance for a code having code rate of 1/2 and a code having code rate of 1/3.

TABLE 1

| Rate | $E_b/N_o$ (dB) | $\gamma^{(1)}$ | $\Delta\gamma$ | FER |
|---|---|---|---|---|
| 1/3 | 0.65 | 0.82 | 0.004 | 0.00400673 |
| 1/2 | 1.0 | 0.75 | 0.0033 | 0.0189107 |

TABLE 2

| Rate | $E_b/N_o$ (dB) | $\beta^{(1)}$ | $\Delta\beta$ | FER |
|---|---|---|---|---|
| 1/3 | 0.58 | 0.44 | 0.96 | 0.0108085 |
| 1/2 | 1.0 | 0.57 | 0.98 | 0.00600817 |

Figure 6:
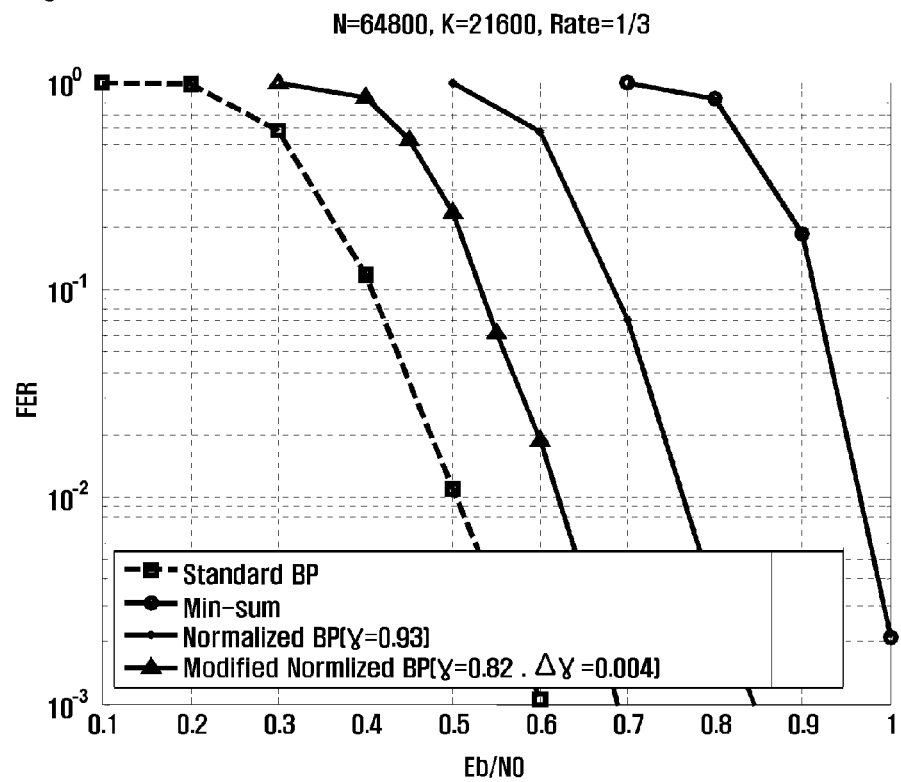
FIG. 6 is a graph showing performance of a decoding method using a variable error correction value in accordance with an embodiment of the present invention.

FIG. 6 is a graph showing performance of a decoding method using a variable error correction value in accordance with an embodiment of the present invention. The drawing shows a simulation result for a code having the code rate of 1/3 based on the values of Table 1 and the performance of conventional decoding algorithm, where $\gamma^{(1)}$
=0.82;

$\Delta\gamma$
=0.0004; the code rate is 1/3; and N=64800.

Figure 7:
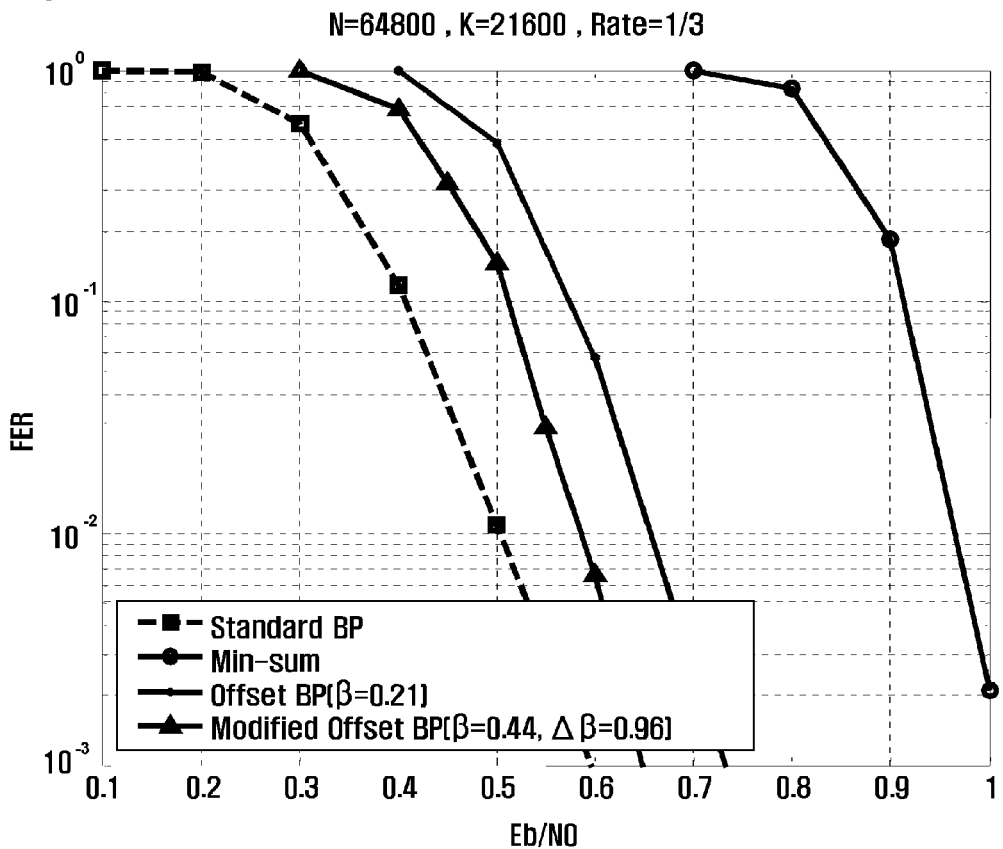
FIG. 7 is a graph showing performance of a decoding method using a variable error correction value in accordance with another embodiment of the present invention.

FIG. 7 is a graph showing performance of a decoding method using a variable error correction value in accordance with another embodiment of the present invention. The drawing shows a simulation result for a code having the code rate of 1/3 based on the values of Table 2 and the performance of conventional decoding algorithm, where $\beta^{(1)}$
=0.44;

$\Delta\beta$
=0.96; the code rate is 1/3; and N=64800.

Referring to FIGS. 6 and 7, the decoding performance of the normalized BP algorithm is improved more than the decoding performance of the min-sum algorithm and the decoding performance of the conventional normalized BP algorithm. The decoding performance, e.g., a frame error rate (FER), of the general BP algorithm (which is a sum-product algorithm) is 0.01. When the normalized BP algorithm having the code rate of 1/3 is compared to the general BP algorithm, the decoding performance of the normalized BP algorithm approaches within 0.12 dB.

Also, the decoding performance of the offset BP algorithm using the variable error correction value is improved more than the decoding performance of the conventional offset BP algorithm. When the offset BP algorithm having the code rate of 1/3 is compared to the general BP algorithm, the decoding performance of the offset BP algorithm approaches within 0.08 dB.

Figure 8:
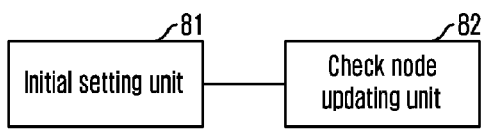
FIG. 8 is a block diagram illustrating a decoding apparatus using a variable error correction value in accordance with an embodiment of the present invention.

FIG. 8 is a block diagram illustrating a decoding apparatus using a variable error correction value in accordance with an embodiment of the present invention.

As shown in FIG. 8, the decoding apparatus using the variable error correction value includes an initial setting unit 81 and a check node updating unit 82.

The initial setting unit 81 sets an initial normalized factor and a normalized factor correction value upon receipt of an input signal from a user.

The check node updating unit 82 initially updates the check node by using the initial normalized factor established in the initial setting unit 81, and the check node is re-updated based on a variable error correction value acquired by adding the initial normalized factor and the normalized factor correction value.

Herein, when the check node is to be re-updated, the check node updating unit 82 acquires a first value by adding the normalized factor correction value and the variable error correction value used in the previous update, and the first value is used as a variable error correction value in the present update.

Also, in the check node re-updating operation, when values of messages inputted into the check node are large, values of messages outputted from the check node are large. Therefore, as the iteration number is increased, the check node updating unit 82 increases the normalized factor at an appropriate ratio.

In another embodiment, the decoding apparatus using the variable error correction value includes an initial setting unit 81 and a check node updating unit 82.

The initial setting unit 81 sets an initial offset factor and an offset factor correction value upon receipt of an input signal from a user.

The check node updating unit 82 initially updates the check node by using the initial offset factor established in the initial setting unit 81, and the check node is re-updated based on a variable error correction value acquired by multiplying the initial offset factor by the offset factor correction value.

Herein, when the check node is to be re-updated, the check node updating unit 82 acquires a second value by multiplying the offset factor correction value by the variable error correction value used in the previous update, and the second value is used as the variable error correction value in the present update.

Also, in the check node re-updating operation, when values of messages inputted into the check node are large, values of messages outputted from the check node are large. Therefore, as the iteration number is increased, the check node updating unit 82 decreases the offset factor $\beta$ at an appropriate ratio.

The method of the present invention may be programmed in a computer language. Codes and code segments constituting the computer program may be easily inferred by a computer programmer skilled in the art. Furthermore, the computer program may be stored in a computer-readable recording medium including all kinds of media such as CD-ROM, RAM, ROM, floppy disk, hard disk and magneto-optical disk, and read and executed by a computer to embody the methods.

The present application contains subject matter related to Korean Patent Application Nos. 2007-0131837 and 2008-0043579, filed in the Korean Intellectual Property Office on Dec. 15, 2007, and May 9, 2008, respectively, the entire contents of which are incorporated herein by reference.

While the present invention has been described with respect to the specific embodiments, it will be apparent to those skilled in the art that various changes and modifications may be made without departing from the spirit and scope of the invention as defined in the following claims.

The invention claimed is:

1. A decoding method, comprising:
    setting, by a decoding apparatus, an initial normalized factor and a normalized factor correction value;
    initially updating a check node based on the initial normalized factor; and
    updating the check node based on a variable error correction value acquired by adding the initial normalized factor and the normalized factor correction value.

2. The decoding method of claim 1, further comprising:
    re-updating the check node based on a present variable error correction value obtained by adding the normalized factor correction value and the variable error correction value used in the previous update.

3. The decoding method of claim 1, wherein the variable error correction value is increased as an iteration number of check node updating operation is increased.

4. The decoding method of claim 1, wherein the normalized factor correction value is determined as a corresponding to the initial normalized factor value based on a curve fitting method.

5. A decoding method, comprising:
    setting, by a decoding apparatus, an initial offset factor and an offset factor correction value;
    initially updating a check node based on the initial offset factor; and
    updating the check node based on a variable error correction value acquired by multiplying the initial offset factor by the offset factor correction value.

6. The decoding method of claim 5, further comprising:
re-updating the check node based on a present variable error correction value obtaining by multiplying the offset factor correction value by the variable error correction value used in the previous update.

7. The decoding method of claim 5, wherein the variable error correction value is decreased as an iteration number of check node updating operation is increased.

8. The decoding method of claim 5, wherein the offset factor correction value is determined as a value corresponding to the initial offset factor based on a curve fitting method.

9. A decoding apparatus, comprising:
a initial setting unit for setting an initial normalized factor and a normalized factor correction value; and
a check node updating unit for initially updating a check node based on the initial normalized factor and updating the check node based on a variable error correction value acquired by adding the initial normalized factor and the normalized factor correction value.

10. The decoding apparatus of claim 9, wherein the check updating unit re-updates the check node based on a present variable error correction value acquired by adding the normalized factor correction value and the variable error correction value used in the previous update.

11. The decoding apparatus of claim 9, wherein the variable error correction value is increased as an iteration number of check node updating operation is increased.

12. A decoding apparatus, comprising:
a initial setting unit for setting an initial offset factor and a offset factor correction value; and
a check node updating unit for initially updating a check node based on the initial offset factor and updating the check node based on a variable error correction value acquired by multiplying the initial offset factor by the offset factor correction value.

13. The decoding apparatus of claim 12, wherein the check updating unit re-updates the check node based on a present variable error correction value acquired by multiplying the offset factor correction value by the variable error correction value used in the previous update.

14. The decoding apparatus of claim 12, wherein the variable error correction value is decreased as an iteration number of check node updating operation is increased.

* * * * *